United States Patent [19]
Hegedus

[11] Patent Number: 6,079,874
[45] Date of Patent: Jun. 27, 2000

[54] TEMPERATURE PROBES FOR MEASURING SUBSTRATE TEMPERATURE

[75] Inventor: Andreas G. Hegedus, Burlingame, Calif.

[73] Assignee: Applied Materials, Inc., Santa Clara, Calif.

[21] Appl. No.: 09/019,426

[22] Filed: Feb. 5, 1998

[51] Int. Cl.[7] ................................ G01K 3/00; G01J 5/00; C23C 16/00
[52] U.S. Cl. .......................... 374/112; 374/115; 374/124; 392/388; 118/725; 219/402
[58] Field of Search .................... 374/112, 115, 374/130, 131, 124; 219/402, 403; 392/388; 118/724, 725

[56] References Cited

U.S. PATENT DOCUMENTS

| | | | |
|---|---|---|---|
| 5,155,336 | 10/1992 | Gronet et al. | 219/411 |
| 5,660,472 | 8/1997 | Peuse et al. | 374/131 |
| 5,755,511 | 5/1998 | Peuse et al. | 374/128 |
| 5,820,261 | 10/1998 | Yam | 374/2 |

*Primary Examiner*—Randy W. Gibson
*Attorney, Agent, or Firm*—Fish & Richardson

[57] ABSTRACT

An apparatus accurately measures a temperature of a substrate in a thermal processing chamber. The apparatus has a support structure to support the substrate within the thermal processing chamber. A first probe is provided with an input end positioned to receive radiation from the substrate during thermal processing. A second probe is also provided with an input end positioned to receive radiation from the substrate during thermal processing. The second probe is positioned such that it is angularly offset from the first probe so radiation provided at an output end of the second probe is out of phase with radiation provided at the output end of the first probe. A junction receives and combines radiation from the output ends of the first and second probes. The radiation is combined to provide an accurate representation of the temperature of a local region of the substrate by compensating for a temperature gradient between the support structure and the substrate.

19 Claims, 3 Drawing Sheets

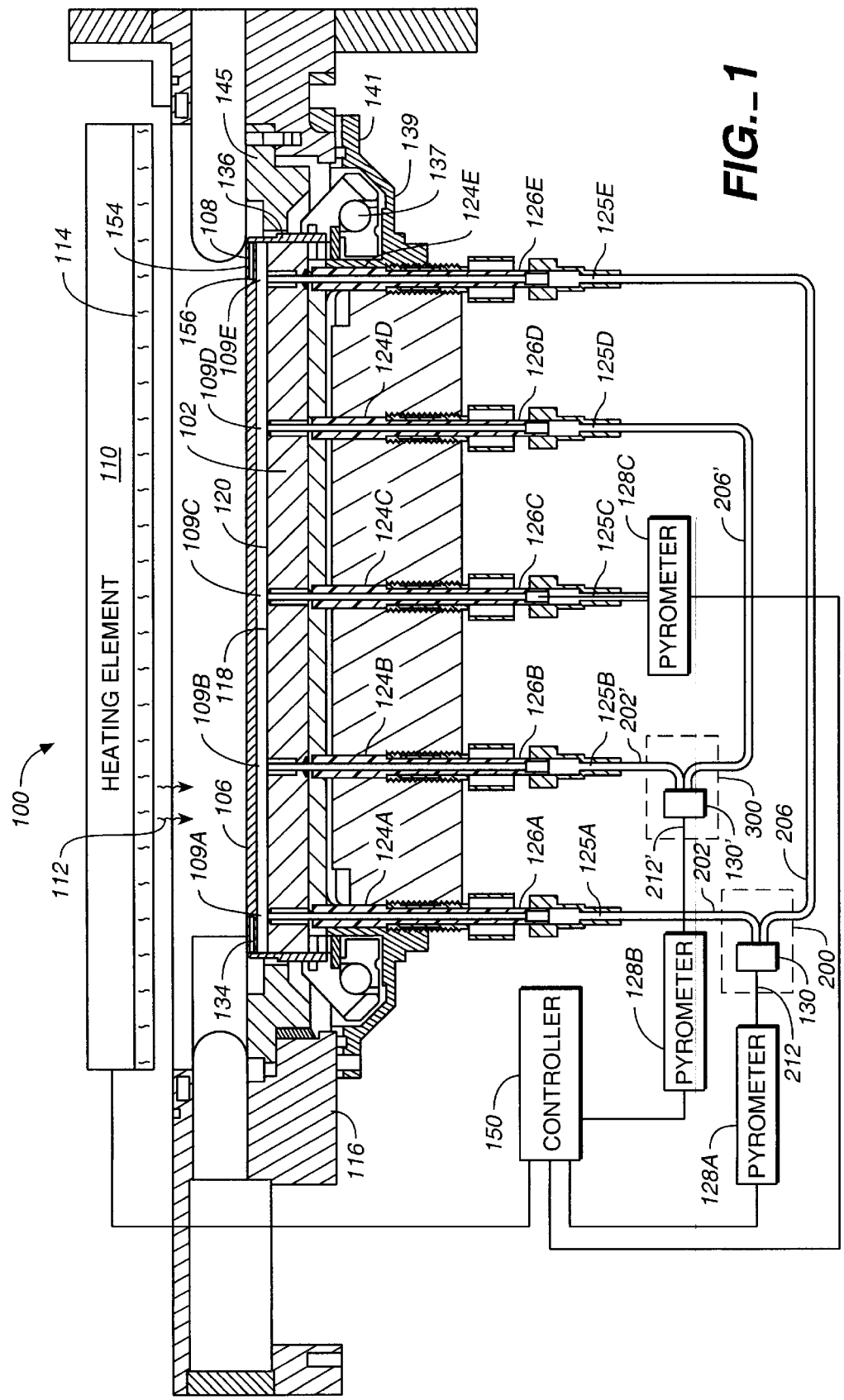
FIG._1

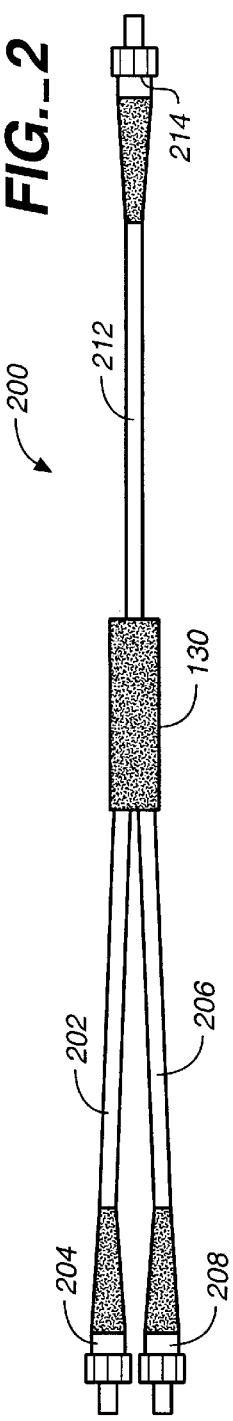
FIG._2
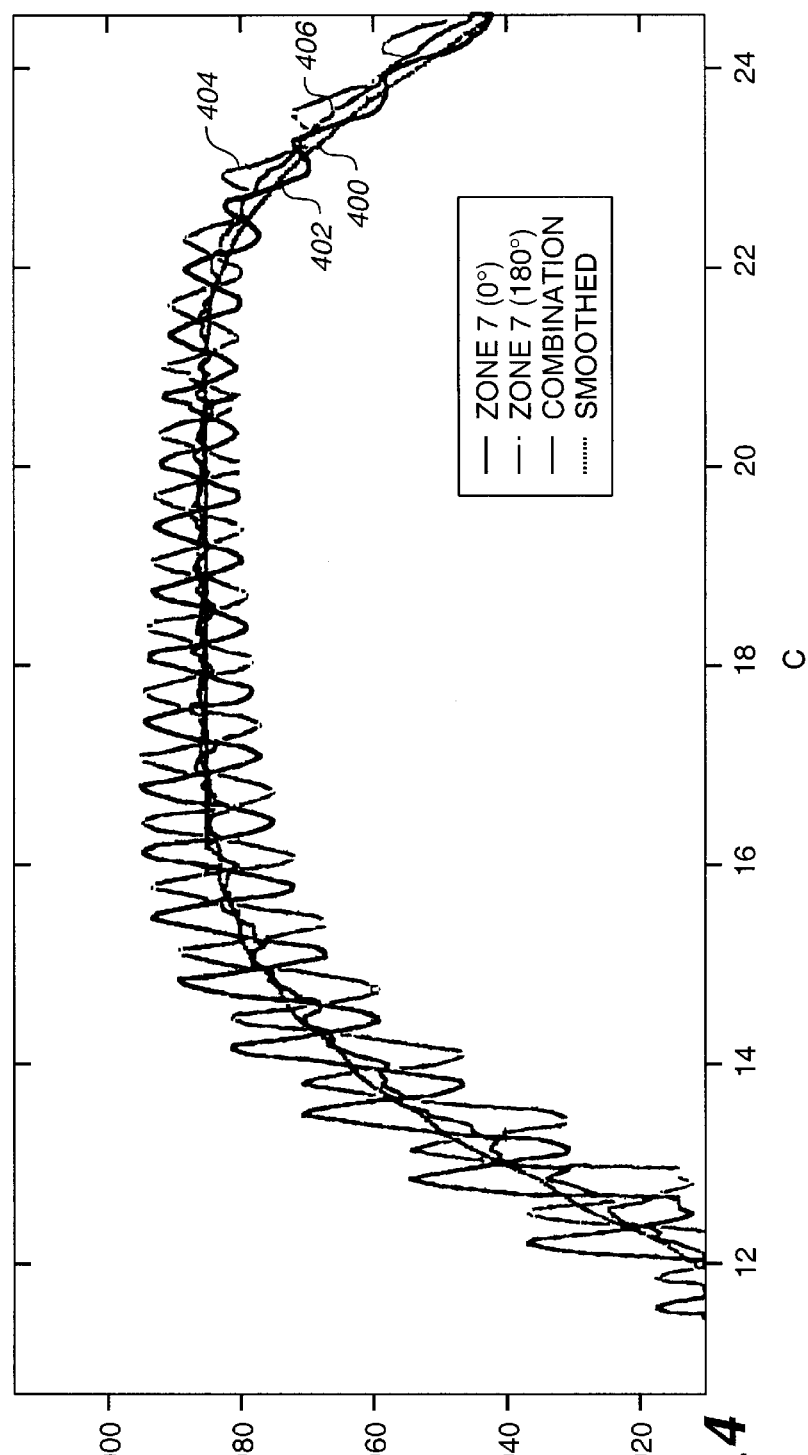
FIG._4

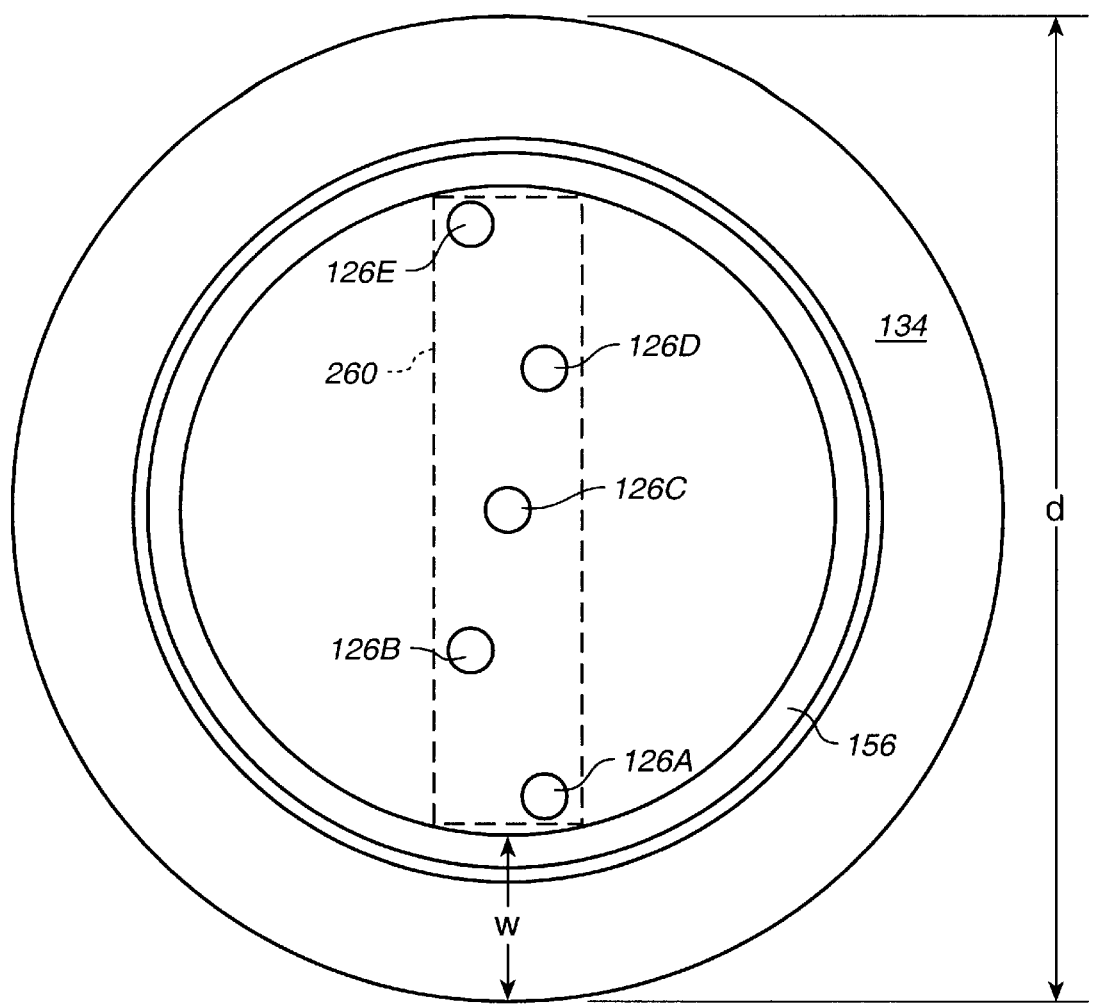
FIG._3

TEMPERATURE PROBES FOR MEASURING SUBSTRATE TEMPERATURE

BACKGROUND OF THE INVENTION

The invention relates to non-contact temperature measurements of a substrate, and more particularly to probes for making such measurements during thermal processing.

Many semiconductor device manufacturing processes require strict control over the process temperatures to increase device performance and yield as well as to ensure process repeatability. To avoid damage to a substrate and undesirable process variations, precise temperature monitoring of the substrate is needed.

One method for determining substrate temperature uses the principles of pyrometry. Pyrometers, or devices based on pyrometry, exploit the general property that objects emit radiation with a particular spectral content and intensity that is characteristic of their temperature. By measuring the emitted radiation, the object's temperature can be determined. In systems that incorporate pyrometers, a reflector is positioned near the substrate to create a virtual blackbody cavity between the reflector and the substrate. Additionally, a temperature probe is used to sample radiation in the cavity through an aperture in the reflector. The sampled intensity is passed to the pyrometer where it is converted to temperature information. Further, to increase the precision of the temperature monitoring process, the emitted radiation intensity can be monitored via a plurality of temperature probes and pyrometers which monitor the temperature of localized regions of the substrate and perform appropriate conversions to obtain temperature information. Temperature readings from various probes can be used for real-time control of heating elements in processing a substrate.

Such a control scheme may be used in process chambers providing independent heating control over various portions of a substrate. For example, some process chambers include a plurality of heating elements, such as lamps, positioned over the substrate to be heated. Depending on the local temperature of the substrate, the power to the individual lamps may be varied to provide temperature uniformity across the entire substrate.

Rapid thermal processing (RTP) is an example of a fabrication process using such a plurality of heating elements. RTP is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of complementary metal-oxide-semiconductor (CMOS) gate dielectric formation by RTO or RTN, thickness, growth temperature and uniformity of the gate dielectrics are critical parameters that influence device performance and fabrication yield. Currently, CMOS devices are being made with dielectric layers that are only 60–80 angstroms (Å) thick and for which thickness uniformity must be held within ±2 Å. This level of uniformity requires that temperature variations across the substrate during high temperature processing cannot exceed a few degrees Celsius (° C.).

The wafer itself often cannot tolerate even small temperature differentials during high temperature processing. If the temperature differential is allowed to rise above, for example, 1–2° C./cm at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are often used.

One problem with temperature probes is that they pick-up not only the temperature of the substrate, but also the temperature of an edge position of a ring, for example, supporting the substrate. The temperature gradient or differential between the support ring and the substrate may undesirably cause inaccurate temperature measurements during processing of the substrate.

SUMMARY

The invention is directed to an apparatus for accurately measuring a temperature of a substrate in a thermal processing chamber. The apparatus has a support structure to support the substrate within the thermal processing chamber. A first probe is provided with an input end positioned to receive radiation from the substrate during thermal processing. A second probe is also provided with an input end positioned to receive radiation from the substrate during thermal processing. The second probe is positioned such that it is angularly offset from the first probe so radiation provided at an output end of the second probe is out of phase with radiation provided at the output end of the first probe. A junction receives and combines radiation from the output ends of the first and second probes. The radiation is combined to provide an accurate representation of the temperature of a local region of the substrate by compensating for a temperature gradient between the support structure and the substrate.

Implementations of the invention may include one or more of the following. The junction is formed from a bifurcated light pipe where each temperature probe is a fiber optic cable joined at the junction. Further, the first and second probes are positioned 180 degrees apart. The radiation at the output ends of the first and second temperature probes is averaged by destructive interference at the junction.

In another part of the implementation, a reflector is positioned near the substrate within the process chamber to form a reflecting cavity therebetween. The reflector has a pair of openings to receive a respective one of the first and second probes. The openings are angularly offset from each other.

Among the advantages of the invention are the following. The invention eliminates noise associated with the temperature gradient introduced by the substrate support structure and permits a more accurate substrate temperature reading. The effect of the temperature gradient at an edge of the substrate is more accurately accounted for. Further, the increased accuracy in substrate temperature determination is provided by an assembly that is simple to assemble, reliable and inexpensive.

Other advantages and features of the present invention will become apparent from the following description, including the drawings and claims.

BRIEF DESCRIPTION OF THE DRAWINGS

FIG. 1 is a cross-sectional side view of an RTP system;

FIG. 2 is a side view of a junction for receiving outputs from complementary temperature probes;

FIG. 3 is a top view of a support structure and reflector of the RTP system of FIG. 1; and FIG. 4 is chart illustrating the effects of a destructive interference in accordance with the present invention.

DESCRIPTION

In the following description, the term "substrate" is intended to broadly cover any object that is being processed in a thermal process chamber and the temperature of which is being measured during processing. The term "substrate" includes, for example, semiconductor wafers, flat panel displays, and glass plates or disks.

FIG. 1 shows an RTP system including a process chamber 100 for processing a substrate 106. The substrate 106 is positioned inside the chamber 100 on a substrate support structure 108 and is heated by a heating element 110 located directly above the substrate. The heating element 110 generates radiation 112 which enters the process chamber 100 through a water-cooled quartz window assembly 114 above the substrate 106.

A suitable heating element 110 is disclosed in U.S. Pat. No. 5,155,336, incorporated herein by reference. This heating element uses light pipes to deliver highly collimated radiation from tungsten-halogen lamps to the processing chamber 100. The lamps may be divided into twelve zones which are located in a radially symmetrical manner. The zones can be individually adjusted to allow the radiative heating of different areas of substrate 106 to be controlled.

Beneath the substrate 106 is a reflector 102 which is mounted on a water-cooled, stainless steel base 116. The reflector 102 may be made of aluminum and may have a highly reflective surface coating 120. The underside of substrate 106 and the top of the reflector 102 form a reflecting cavity 118 for enhancing the effective emissivity of the substrate.

The temperatures at localized regions 109A–109E of the substrate 106 are measured by a plurality of temperature probes 126A–126E. These temperature probes sample the radiation within the reflecting cavity 118 to provide temperature readings to a controller 150. The temperature probes 126A and 126E form a complementary pair of probes that are spaced angularly opposite and equidistant to each other. For example, they may be spaced 180 degrees apart on an imaginary circle concentric with the substrate 106. Similarly, the temperature probes 126B and 126D from a second complementary pair of probes that are positioned angularly opposite to each other. The temperature probe 126C is positioned to measure the temperature of the substrate at approximately its center and therefore is not paired with another probe (See also FIG. 3). Although the embodiment of FIG. 1 has two complementary probe pairs 126A–126E and 126B–126D and one central probe 126C, the invention may deploy a plurality of complementary probe pairs that are spaced angularly opposite to each other. Moreover, the probe pairs may be positioned at various angular displacements or offsets relative to the remaining probe pairs.

The outputs of the temperature probes 126A and 126E are transmitted via fiber optic cables 202 and 206, respectively, and are provided to an optical junction 130 which combines and averages their outputs. The averaged output is transmitted via another fiber optic cable 212 to a pyrometer 128A. Collectively, the junction 130 and the cables 202, 206 and 212 are called a light pipe 200 (See FIG. 2). Similarly, the outputs of the temperature probes 126B and 126D are provided to another optical junction 130' of a light pipe 300 which is identical to the light pipe 200. The optical junction 130' combines and averages the outputs of the cables 202' and 206' before providing the averaged output to a second pyrometer 128B via the cable 212'. The output of the temperature probe 126C is directly provided to a third pyrometer 128C. In the described embodiment, each of the pyrometers 128A–128C has a narrow bandwidth (e.g. about 40 nm) located at about 950 nm. The backside of the quartz window 114 is ideally coated with an inert material which is transparent to thermal radiation in all but this narrow band of wavelengths, thereby reducing the likelihood that the heat source will introduce stray radiation into the reflecting cavity. The output of the pyrometers 128A, 128B and 128C are fed to the controller 150, which in turn drives the heating element 110 to appropriately adjust the substrate temperature in the chamber 100.

Each of the temperature probes 126A–126E is positioned within conduits 124A–124E, respectively, so that the uppermost end is flush with or slightly below the top of the reflector 102. The other end of each of the temperature probes 126A–126E is connected to one of a plurality of flexible optical fibers 125A–125E that transmits sampled light from the substrate 106 and the reflecting cavity 118 to pyrometers 128A–128C, respectively.

Referring back to the reflector 102, the highly reflective multi-layered coating 120 may include a thin bottom layer of gold deposited onto the surface of the reflector body. Gold is used because it has a reflectivity of about 0.975 in the infrared wavelength range of interest (i.e., about 950 nm). To further enhance the reflectivity of the gold layer, a quarter-wave stack may be formed on top of the gold layer. The quarter-wave stack is made up of alternating dielectric layers which have different indices of refraction and a thickness equal to one-quarter of the wavelength to which the pyrometer is most sensitive (e.g., one-quarter of 950 nm). The top layer of the coating 120 may be a passivation layer. This layer prevents the gold reflecting layer from possibly contaminating the RTP chamber. The passivation layer may be made of silicon dioxide, aluminum oxide, silicon nitride, or any other material that will passivate the reflecting layer without degrading its reflective properties at the wavelength of interest. Other reflecting materials may also be used, including those disclosed in U.S. application Ser. No. 08/845,931, filed Apr. 29, 1997, entitled "REFLECTOR HAVING A METALLIC BONDING LAYER FOR A SEMICONDUCTOR PROCESSING CHAMBER"; and U.S. application Ser. No. 08/697,633, filed Aug. 28, 1996, entitled "REFLECTOR FOR A SEMICONDUCTOR PROCESSING CHAMBER", both of which are assigned to the assignee of the present application and which are incorporated herein by reference.

The invention operates with processing systems that are designed for eight-inch (200 mm) and twelve-inch (300 mm) silicon wafers, among others. In processing systems that are designed for eight-inch silicon wafers, the distance between the substrate 106 and reflector 102 is between 3 mm and 9 mm, and ideally between 5 mm and 8 mm. Moreover, the width-to-height ratio of cavity 118 should be larger than about 20:1. If the separation is made too large, the emissivity-enhancement effect that is attributable to the virtual blackbody cavity that is formed will decrease. On the other hand, if the separation is too small, e.g., less than about 3 mm, then the thermal conduction from the substrate to the cooled reflector will increase, thereby imposing an unacceptably large thermal load on the heated substrate. Since the main mechanism for heat loss to the reflector or reflecting plate will be conduction through the gas, the thermal loading will depend up the type of gas and the chamber pressure during processing.

During thermal processing, the support structure 108 is rotated. Thus, paired probes 126A–126E and 126B–126D can sample the temperature profiles of corresponding annular ring areas on the substrate 106. The temperature indications associated with each of probes 126A–126E may be corrected according to the individual sensitivity to variations in emissivity associated with the probe location using methods such as that disclosed in U.S. patent application Ser. No. 08/641,477, entitled "METHOD AND APPARATUS FOR MEASURING SUBSTRATE TEMPERATURES", filed on May 1, 1996, assigned to the assignee of the present invention, which is incorporated herein by reference.

The support structure 108, which rotates the substrate during processing, includes a support ring 134 which contacts the substrate 106 around the substrate's outer perimeter, thereby leaving all of the underside of the substrate 106 exposed except for a small annular region about the outer perimeter. To minimize a thermal discontinuity at the edge of substrate 106 during processing, the support ring 134 may be made of the same, or similar, material as the substrate, e.g., silicon or silicon carbide. Moreover, the thermal discontinuity is accounted for in arriving at the temperature of the substrate in accordance with the invention, as discussed below.

The support ring 134 rests on a rotatable tubular quartz cylinder 136 that is coated with silicon to render it opaque in the frequency range of pyrometers 128A–128C. The silicon coating on the cylinder 136 acts as a baffle to block out radiation from external sources that might contaminate the temperature measurements. The bottom of the quartz cylinder is held by an annular upper bearing race 141 which rests on a plurality of ball bearings 137 that are, in turn, held within a stationary, annular, lower bearing race 139. The ball bearings 137 may be made of steel and coated with silicon nitride to reduce particulate formation during operation. The upper bearing race 141 is magnetically-coupled to an actuator (not shown) which rotates the cylinder 136, the support ring 134 and the substrate 106 during thermal processing.

The support ring 134 is designed to create a light tight seal with the cylinder 136. As shown in FIGS. 1 and 3, extending from the bottom surface of the support ring 134 is a cylindrically shaped lip 154 which has an outside diameter that is slightly smaller than the inside diameter of the cylinder 136, so that it fits into the cylinder 136 and forms a light seal. On the inside region of the support ring, there is a shelf 156 for supporting substrate 106. The shelf 156 is a region around the inside circumference of the support ring 134 that is lower than the rest of the support ring 134. The annular shelf 156 is selected such that the support ring 134 contacts the substrate 106 substantially at an edge portion of the substrate such that scratches formed near the edges are less likely to affect the yield of the substrate. The surface of the shelf 156 may assume one of a variety of shapes, including planar, concave, or convex.

The support ring 134 has an outer radius that is larger than the radius of the cylinder 136 so that it extends out beyond the cylinder 136. The annular extension of the support ring beyond the cylinder 136, in cooperation with a purge ring 145 located below it, functions as a baffle which prevents stray light from entering the reflecting cavity at the backside of the substrate 106. To further reduce the possibility of stray light reflecting into the reflecting cavity, the support ring 134 and the purge ring 145 may also be coated with a material that absorbs the radiation generated by heating element 110 (e.g., a black or grey material).

The purge ring 145 which is fitted into the chamber body surrounds the cylinder 136. The purge ring 145 has an internal annular cavity which opens up to a region above the upper bearing race 141. The internal cavity is connected to a gas supply through a passageway. During processing, a purge gas is delivered to the chamber through the purge ring 145.

Referring now to FIG. 2, details on the light pipe 200 for connecting the complementary temperature probes 126A and 126E are shown. As noted above, the light pipe 300 is constructed and operates in a similar fashion to that of the light pipe 200. The light pipe 200 has a plurality of probe connectors 204 and 208, each of which is adapted to connect with a corresponding temperature probe 126A or 126E. The probe connectors 204 and 208 deliver the light output to the fiber optic cables 202 and 206, respectively. Due to the positioning of the temperature probe complementary pairs, light waves carried by the fiber optic cables 202 and 206 are opposite in phase. When the output of the fiber optic cables 202 and 206 are combined at the optical junction 130, the phases are averaged by a process known as destructive interference. The average output of the optical junction 130 is transmitted by the cable 212 to the pyrometer 128A via a connector 214. The averaging of the phases eliminates artifacts associated with the temperature gradient of the supporting ring 134 and the substrate 106. In this embodiment, the light pipe 200 may be a BIF-50 model, available from Ocean Optics, Inc. Of Dunedin, Fla., which is a 50 micron bifurcated fiber optic pipe with two separate optical fibers in a "Y" configuration and terminated in connectors 204, 208 and 214, which may be SMA-type connectors. The light pipe 200 can be made of any appropriate heat-tolerant and corrosion-resistant material, such as quartz, that can transmit the sampled radiation to the pyrometer.

Referring to FIG. 3, a top view of the temperature measurement apparatus of the invention is shown. A plurality of complementary pairs of temperature probes 126A–126E and 126B–126D and the central temperature probe 126C are positioned in apertures in the reflector 102 to sense the temperature of the substrate supported by the ring 134. The temperature information is averaged at junctions 130 and 130' (FIG. 1) to eliminate artifacts associated with the above discussed temperature gradient. Generally, the artifacts are most pronounced near the perimeter of the ring 134. Therefore, the complementary pairs of probes 126A–126E and 126B–126D provide the appropriate ring temperature gradient compensation. The temperature gradient is minimal near the center of the support ring 134. Therefore, the temperature probe 126C need not be averaged with another complementary probe.

Although FIG. 3 shows two complementary probe pairs 126A–126E and 126B–126D and one central probe 126C, the invention may deploy a plurality of complementary probe pairs that are spaced angularly opposite and equidistant to each other. Moreover, the probe pairs may be positioned at various angular displacements or offsets relative to the remaining probe pairs. Further, to sense a region 240 spanning the diameter of the substrate 106, the probes may be positioned pairwise in alternatingly positive and negative angular displacements about the center of the substrate 106. In such instances, the probes are positioned in a zig-zag manner relative to each other.

Turning now to FIG. 4, a chart illustrating the correction of the temperature gradient artifact in accordance with the invention is shown. Particularly, FIG. 4 shows a plot of temperature measurements 402 from the probe 126A as well as temperature measurements 404 from the probe 126E. As shown, the temperature measurements 402 and 404 are out of phase with each other.

An exemplary output of the junction 130 is illustrated as a plot 406, which is an average of temperature measurements 402 and 404. The plot 406 is relatively smooth when compared to the oscillations present in plots 402 or 404. The plot 406 more closely tracks a smoothed curve 400 which represents a running average of 25 measurements made by the probe 126A. The plot 406 thus illustrates the operation of the optical junction 130 in real-time, while the plot 400 can only be obtained after a number of samples have been collected. Thus, the output at the optical junction 130 may be used in real-time to accurately account for artifacts introduced by the temperature gradient in the ring 134.

The output of the optical junctions 130 and 130' may be used in a control loop for accurately heating the substrate to the desired temperature. The control loop receives information from the optical junctions 130 and 130' to control the heating element 110. The heating element 110 delivers highly collimated radiation from tungsten-halogen lamps to the processing chamber 100. The lamps may be divided into twelve zones which are located in a radially symmetrical manner. The zones can be individually adjusted to allow the radiative heating of different areas of the substrate 106 to be controlled. As the substrate 106 rotates, temperature measurements are made at different radial locations on the backside of the substrate 106. Each temperature probe produces an average temperature over a different annular region of the substrate which coincide with the radial zones of the lamps. The controller 150 receives the corrected temperature measurements and adjusts the power level of the lamps to achieve a substrate temperature as specified by a predefined temperature cycle profile supplied to the controller 150. Throughout the process cycle, the controller 150 automatically adjusts the power levels delivered to the different lamp zones so that any temperature deviations away from the desired temperature profile are corrected for. In this manner, the temperature of the substrate is more accurately determined by compensating for the effects of a temperature gradient at an edge of the substrate support structure. Further, the increased accuracy in substrate temperature determination is provided in a device that is simple to assemble, reliable and inexpensive.

Although a bifurcated cable with a junction for receiving and combining radiation from the output ends of the complementary probes has been discussed, other compensation techniques may be used. For instance, in place of the optical averaging junction, outputs from various individual probes may be electronically averaged or may be averaged by a computer with suitable digital signal processing techniques.

Other embodiments are within the scope of the following claims.

What is claimed is:

1. An apparatus for measuring a temperature of a substrate in a thermal processing chamber, comprising:
    a support structure to support the substrate within the thermal processing chamber;
    a first probe having an input end positioned to receive radiation from the substrate during processing;
    a second probe having an input end positioned to receive radiation from the substrate during processing, said second probe positioned such that it is angularly offset from said first probe so radiation provided at an output end of said second probe is out of phase with radiation provided at the output end of said first probe; and
    a junction configured to receive radiation from the output ends of said first and second probes, wherein such radiation is combined to provide a signal representative of a temperature of a local region of the substrate.

2. The apparatus of claim 1, wherein the junction is formed from a bifurcated light pipe.

3. The apparatus of claim 1, wherein said first and second probes each includes a fiber optic cable joined at said junction.

4. The apparatus of claim 1, wherein said first and second probes compensate for a temperature gradient between said support structure and the substrate.

5. The apparatus of claim 1, wherein the first and second probes are positioned 180 degrees apart.

6. The apparatus of claim 1, wherein the radiation at the output ends of the first and second probes is averaged by destructive interference at the junction.

7. The apparatus of claim 1, further comprising:
    a third probe having an input end positioned to receive radiation from the substrate during processing;
    a fourth probe having an input end positioned to receive radiation from the substrate during processing, said fourth probe positioned such that it is angularly offset from said third probe so radiation provided at an output end of said fourth probe is out of phase with radiation provided at the output end of said third probe; and
    a second junction configured to receive radiation from the output ends of said third and fourth probes, wherein such radiation is combined to provide a signal representative of a temperature of a second local region of the substrate.

8. The apparatus of claim 1, further including a reflector positioned near the substrate and forming a reflecting cavity therebetween, said reflector having a pair of openings to receive a respective one of the input ends of the first and second probes, said openings being angularly offset from each other.

9. The apparatus of claim 1, further comprising a pyrometer optically coupled to said junction.

10. The apparatus of claim 1, wherein said first and second probes are placed on opposite sides of an axis of rotation of the substrate at an approximately equal distance from the substrate center.

11. A rapid thermal processing system for heating a substrate, comprising:
    a heating element located adjacent a first side of the substrate to heat the substrate to a desired temperature;
    a support structure to support the substrate in a process chamber;
    a reflector located adjacent to a second side of the substrate, the reflector having first and second openings, the first and second openings being angularly across from each other;
    a first probe having an input end positioned in the first opening to receive radiation from the substrate during processing;
    a second probe having an input end positioned in the second opening to receive radiation from the substrate during processing so radiation provided at an output end of the second probe is out of phase with radiation provided at the output end of the first probe;
    an optical junction configured to receive radiation from the respective output ends of the first and second probes, wherein such radiation is combined by destructive interference to provide a signal representative of a temperature of a local region of the substrate;
    a pyrometer coupled to said junction to produce a temperature reading; and
    a controller coupled to the pyrometer and to the heating element to adjust the temperature of the substrate in response to the temperature reading.

12. The rapid thermal processing system of claim 11, wherein each of the first and second probes is a bifurcated light pipe.

13. The rapid thermal processing system of claim 11, wherein the first and second probes each includes a fiber optic cable joined at said junction.

14. The rapid thermal processing system of claim 11, wherein the first and second probes compensate for a temperature gradient between the support structure and the substrate.

15. The rapid thermal processing system of claim 11, wherein the first and second probes are positioned 180 degrees apart.

16. The rapid thermal processing system of claim 11, wherein the radiation at the respective output ends of the first and second probes is averaged by destructive interference at said junction.

17. A rapid thermal processing system for heating a substrate, comprising:
   a heating element located adjacent a first side of the substrate to heat the substrate to a desired temperature;
   a support ring to support the substrate in a process chamber;
   a reflector located adjacent to a second side of the substrate;
   a first pair of complementary probes, including:
      a first probe having an input end positioned to receive radiation from the substrate during processing; and
      a second probe having an input end positioned to receive radiation from the substrate during processing, said second probe positioned such that it is angularly offset from said first probe so radiation provided at an output end of said second probe is out of phase with radiation provided at an output end of said first probe;
   a second pair of complementary probes, including:
      a third probe having an input end positioned to receive radiation from the substrate during processing; and
      a fourth probe having an input end positioned to receive radiation from the substrate during processing, said fourth probe positioned such that it is angularly offset from said third probe so radiation provided at an output end of said fourth probe is out of phase with radiation provided at an output end of said third probe;
   a first optical junction configured to receive radiation from the output ends of said first and second probes where such radiation is combined by destructive interference to provide signals representative of a temperature of a first region of the substrate;
   a second optical junction configured to receive radiation from the output ends of said third and fourth probes, wherein such radiation is combined by destructive interference to provide signals representative of a temperature of a second region of the substrate;
   first and second pyrometers coupled to said first and second optical junctions, respectively, to produce temperature readings; and
   a controller coupled to the first and second pyrometers and to the heating element to adjust the temperature of the substrate in response to the temperature readings.

18. A method for measuring a temperature of a substrate, comprising:
   placing a respective one of a pair of temperature probes on opposite sides of an axis of rotation of the substrate at an approximate equal distance from a substrate center to measure a substrate temperature; and
   averaging the outputs of said temperature probes to provide a temperature reading of a localized region of the substrate.

19. The method of claim 18, further comprising adjusting a process temperature of the substrate based on the outputs of said temperature probes.

* * * * *